(12) United States Patent
Aso et al.

(10) Patent No.: US 11,843,296 B2
(45) Date of Patent: Dec. 12, 2023

(54) MOTOR AND AIR CONDITIONER

(71) Applicant: Mitsubishi Electric Corporation, Tokyo (JP)

(72) Inventors: Hiroki Aso, Tokyo (JP); Tomoaki Oikawa, Tokyo (JP); Mineo Yamamoto, Tokyo (JP); Hiroyuki Ishii, Tokyo (JP); Junichiro Oya, Tokyo (JP); Yuto Urabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1348 days.

(21) Appl. No.: 16/301,028

(22) PCT Filed: Aug. 4, 2016

(86) PCT No.: PCT/JP2016/072913
§ 371 (c)(1),
(2) Date: Nov. 13, 2018

(87) PCT Pub. No.: WO2018/025367
PCT Pub. Date: Feb. 8, 2018

(65) Prior Publication Data
US 2019/0181712 A1 Jun. 13, 2019

(51) Int. Cl.
*H02K 3/38* (2006.01)
*H02K 11/215* (2016.01)
(Continued)

(52) U.S. Cl.
CPC ............. *H02K 3/38* (2013.01); *F16J 15/441* (2013.01); *F24F 1/0018* (2013.01); *F24F 1/20* (2013.01);
(Continued)

(58) Field of Classification Search
CPC .......... H02K 5/22; H02K 11/215; H02K 3/38; H02K 1/276; H02K 15/10; H02K 1/146;
(Continued)

(56) References Cited

U.S. PATENT DOCUMENTS

2015/0263581 A1* 9/2015 Yamamoto ............. H02K 29/08
310/43
2016/0036279 A1* 2/2016 Aso ......................... H02K 5/225
310/43
(Continued)

FOREIGN PATENT DOCUMENTS

JP H03-091071 U 9/1991
JP 2005-020851 A 1/2005
(Continued)

OTHER PUBLICATIONS

WO-2017085827-A1 machine translation Dec. 16, 2022.*
(Continued)

*Primary Examiner* — Leda T Pham
(74) *Attorney, Agent, or Firm* — POSZ LAW GROUP, PLC

(57) ABSTRACT

A motor includes a stator, and includes a first substrate and a second substrate mounted on the stator. The stator has a stator core in a ring shape and a first coil of a first phase and a second coil of a second phase wound around the stator core. The first substrate includes a first power supply wiring to supply electric power to the first coil. The second substrate has a second power supply wiring to supply electric power to the second coil.

16 Claims, 14 Drawing Sheets

(51) Int. Cl.

| | |
|---|---|
| *H02K 5/22* | (2006.01) |
| *F16J 15/44* | (2006.01) |
| *G01D 5/12* | (2006.01) |
| *G01D 5/14* | (2006.01) |
| *G01R 33/06* | (2006.01) |
| *G01R 33/07* | (2006.01) |
| *F24F 1/0018* | (2019.01) |
| *F24F 1/20* | (2011.01) |
| *H02K 1/14* | (2006.01) |
| *H02K 1/276* | (2022.01) |
| *H02K 3/52* | (2006.01) |
| *H02K 7/08* | (2006.01) |
| *H02K 15/00* | (2006.01) |
| *H02K 15/10* | (2006.01) |
| *H02K 15/12* | (2006.01) |
| *H02K 15/14* | (2006.01) |
| *H02K 21/16* | (2006.01) |

(52) U.S. Cl.
CPC ............... *G01D 5/12* (2013.01); *G01D 5/125* (2013.01); *G01D 5/14* (2013.01); *G01D 5/145* (2013.01); *G01R 33/06* (2013.01); *G01R 33/07* (2013.01); *H02K 1/146* (2013.01); *H02K 1/276* (2013.01); *H02K 3/522* (2013.01); *H02K 5/22* (2013.01); *H02K 7/083* (2013.01); *H02K 11/215* (2016.01); *H02K 15/0062* (2013.01); *H02K 15/10* (2013.01); *H02K 15/12* (2013.01); *H02K 15/14* (2013.01); *H02K 21/16* (2013.01); *H02K 2203/06* (2013.01); *H02K 2211/03* (2013.01)

(58) Field of Classification Search
CPC ........ H02K 7/083; H02K 15/14; H02K 3/522; H02K 21/16; H02K 15/12
See application file for complete search history.

(56) References Cited

U.S. PATENT DOCUMENTS

| | | | | |
|---|---|---|---|---|
| 2016/0197530 A1* | 7/2016 | Fujii | ................... | H02K 11/33 |
| | | | | 310/71 |
| 2017/0294860 A1* | 10/2017 | Yamasaki | ............... | H02P 27/06 |

FOREIGN PATENT DOCUMENTS

| | | | | |
|---|---|---|---|---|
| JP | 2007-228667 A | | 9/2007 | |
| JP | 2008-278718 A | | 11/2008 | |
| JP | 2009-201294 A | | 9/2009 | |
| JP | 2010-130833 A | | 6/2010 | |
| JP | 2014-011899 A | | 1/2014 | |
| JP | 2014011899 A | * | 1/2014 | |
| WO | 2014/057745 A1 | | 4/2014 | |
| WO | WO-2014061359 A1 | * | 4/2014 | ............. F04D 13/06 |
| WO | 2014/080675 A1 | | 5/2014 | |
| WO | WO-2017085827 A1 | * | 5/2017 | ............... H02K 3/04 |

OTHER PUBLICATIONS

JP-2014011899-A machine translation on May 6, 2023.*
Office action dated Jul. 29, 2019 issued in corresponding Korean patent application No. 10-2018-7035288 (and English translation thereof).
Office Action dated Jun. 25, 2019 issued in corresponding JP patent application No. 2018-531048 (and English translation).
Office Action dated Nov. 2, 2021 in connection with counterpart U.K Patent Application No. 1820426.3.
Office action dated Apr. 2, 2020 issued in corresponding Chinese patent application No. 201680087772.0 (and English translation thereof).
International Search Report of the International Searching Authority dated Nov. 8, 2016 for the corresponding International application No. PCT/JP2016/072913 (and English translation).

* cited by examiner

MOTOR AND AIR CONDITIONER

CROSS REFERENCE TO RELATED APPLICATION

This application is a U.S. national stage application of International Patent Application No. PCT/JP2016/072913 filed on Aug. 4, 2016, the disclosure of which is incorporated herein by reference.

TECHNICAL FIELD

The present invention relates to a motor and an air conditioner employing the motor.

BACKGROUND ART

A stator of a motor is generally attached with a ring-shaped substrate (wiring board) having power supply wirings. The substrate is manufactured by being punched from a substrate base material on which wirings and the like are formed. However, since the substrate has a ring shape, the number of substrates punched from the substrate base material having a certain area (obtainable number) is limited.

Therefore, Patent Reference 1 proposes a configuration in which a substrate is separated into two arc-shaped substrates, namely, a first arc-shaped substrate and a second arc-shaped substrate. A common pattern is formed on the first arc-shaped substrate, and three power-line-connection patterns connected respectively to U-phase, V-phase and W-phase coils are formed on the second arc-shaped substrate.

PATENT REFERENCE

Patent Reference 1: Japanese Patent Application Publication No. 2014-11899 (see paragraphs 0024 to 0025)

In the above-described configuration, however, in a case where terminals for the coils of the phases are arranged at positions apart from each other on the stator, the second arc-shaped substrate has to be enlarged in order to connect the power-line-connection patterns to the corresponding terminals. Accordingly, the number of substrates obtainable from the substrate base material cannot be increased and reduction in manufacturing cost is difficult.

SUMMARY

The present invention is made to solve the above-described problem, and an object of the present invention is to increase the number of substrates obtainable from the substrate base material and reduce manufacturing cost of the motor.

A motor according to the present invention includes a stator having a stator core in a ring shape, a first coil of a first phase wound around the stator core, and a second coil of a second phase wound around the stator core, a first substrate mounted on the stator and having a first power supply wiring to supply electric power to the first coil, and a second substrate mounted on the stator and having a second power supply wiring to supply electric power to the second coil.

An air conditioner according to the present invention includes an outdoor unit having a first fan and a first motor driving the first fan, an indoor unit having a second fan and a second motor driving the second fan, and a refrigerant pipe connecting the outdoor unit and the indoor unit. At least one of the first motor and the second motor has a stator having a stator core in a ring shape, a first coil of a first phase wound around the stator core, and a second coil of a second phase wound around the stator core, a first substrate mounted on the stator and having a first power supply wiring to supply electric power to the first coil, and a second substrate mounted on the stator and having a second power supply wiring to supply electric power to the second coil.

According to the present invention, the first substrate has the first power supply wiring and the second substrate has the second power supply wiring. Therefore, the first substrate and the second substrate can be downsized even in a case where a terminal for the first coil and a terminal for the second coil are apart from each other. Accordingly, the number of the substrates obtainable from a substrate base material can be increased and manufacturing cost can be reduced.

DETAILED DESCRIPTION

First Embodiment (Configuration of Stator Assembly)

Figure 1:
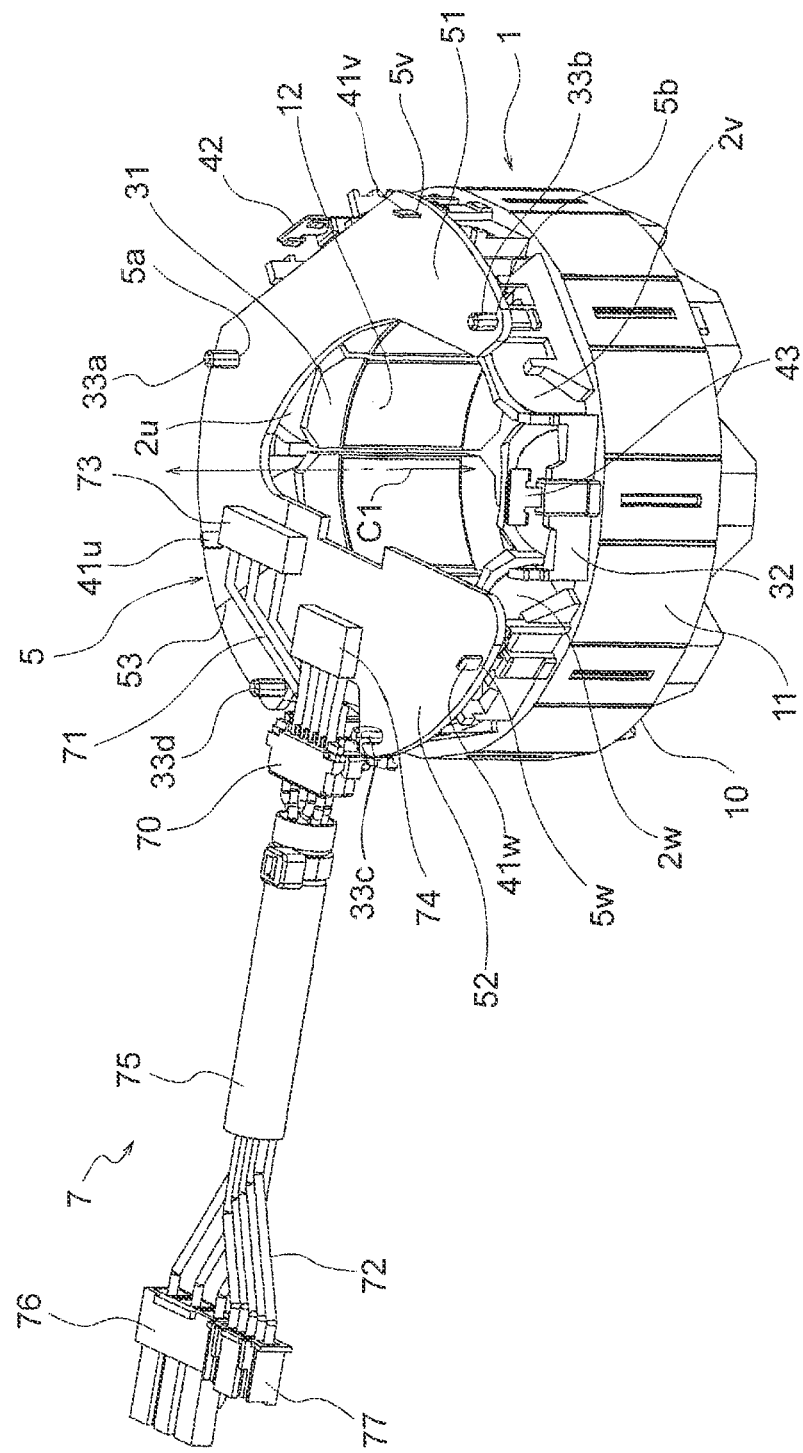
FIG. 1 is a perspective view showing a configuration of a stator assembly in a first embodiment of the present invention.
Figure 2:
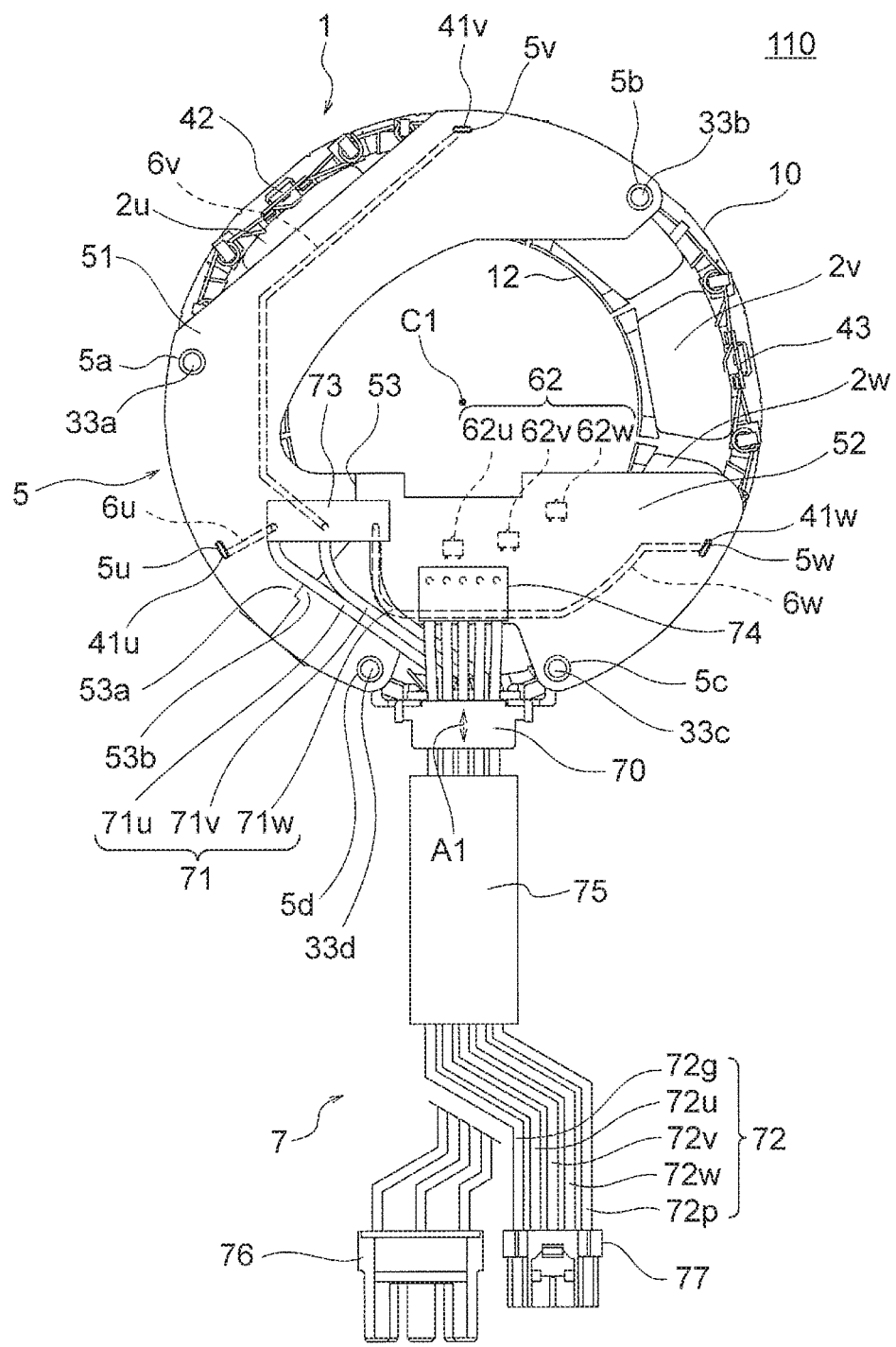
FIG. 2 is a plan view showing the configuration of the stator assembly in the first embodiment.

FIG. 1 is a perspective view showing a configuration of a stator assembly 110 in a first embodiment of the present invention. FIG. 2 is a plan view showing the configuration of the stator assembly 110. The stator assembly 110 includes a stator 1, a substrate 5 mounted on the stator 1, and a lead wire group 7 connected to the substrate 5.

The stator 1 includes a stator core 10 in a ring shape, an insulator (insulation part) 3 provided on the stator core 10, and coils 2 wound around the stator core 10. In the following description, a direction of an axis line C1 which is a center of the ring-shaped stator 1 will be referred to simply as an "axial direction". Further, a circumferential direction about the axis line C1 will be referred to simply as a "circumferential direction". A radial direction about the axis line C1 will be referred to simply as a "radial direction".

The substrate 5 is a wiring board (printed circuit board) arranged on one side of the stator core 10 in the axial direction (the upper side in FIG. 1). This substrate 5 is made by combining a first substrate 51 and a second substrate 52 together at a connection part 53 (separation surface).

(Configuration of Stator)

Figure 3:
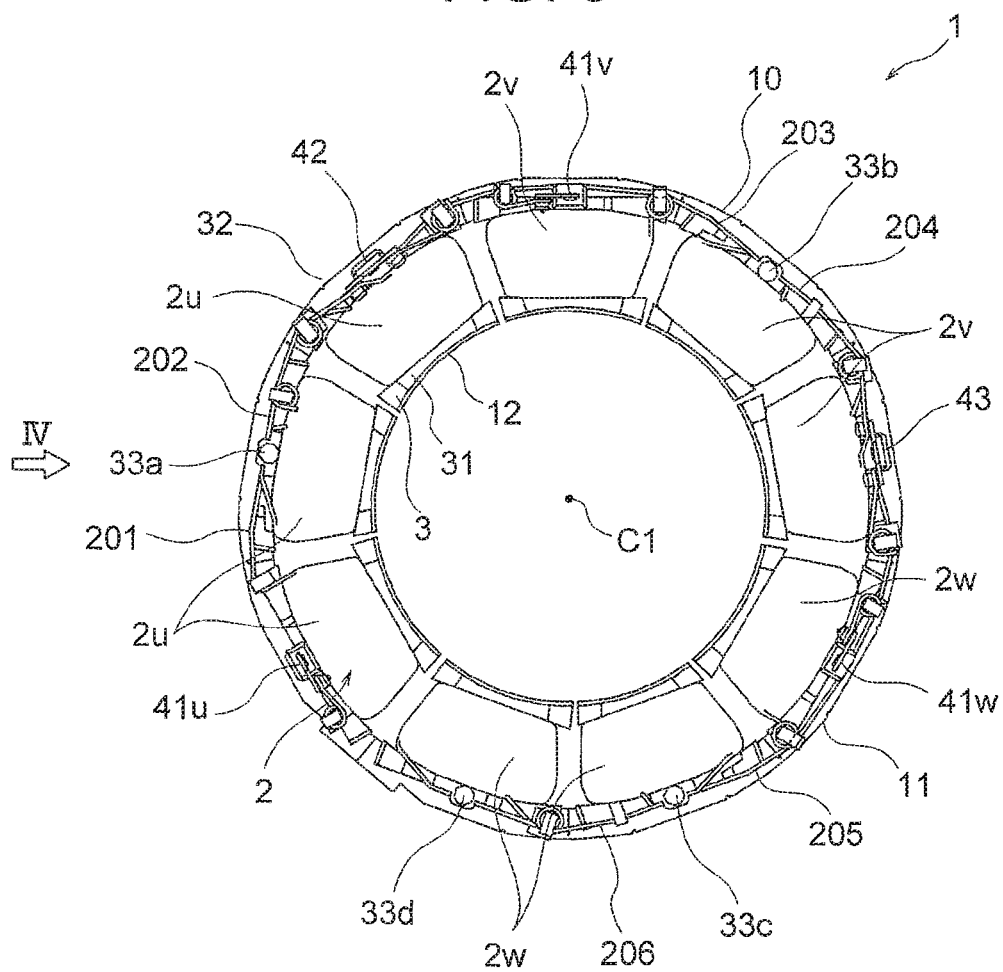
FIG. 3 is a plan view showing a configuration of a stator in the first embodiment.
Figure 4:
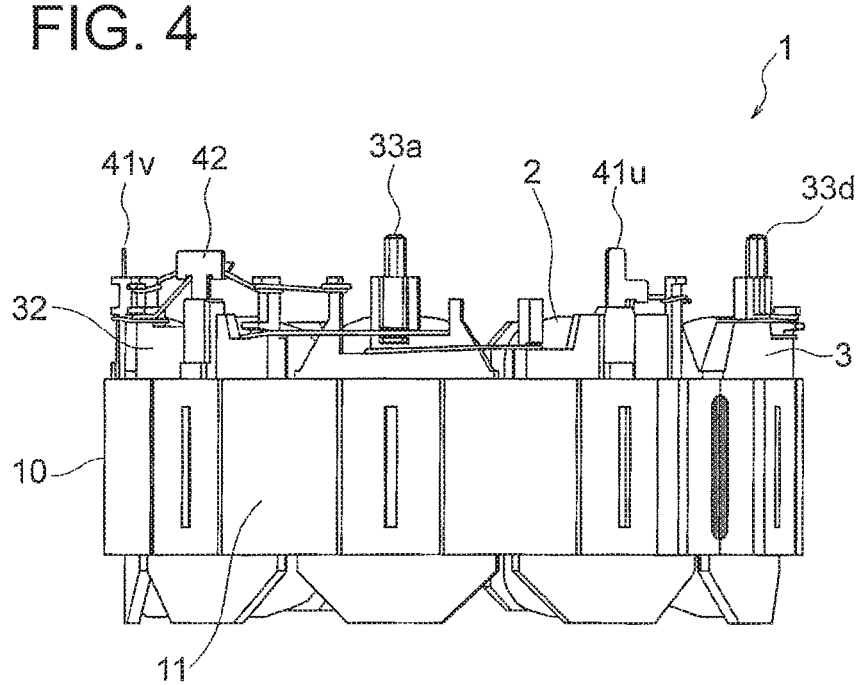
FIG. 4 is a side view showing the configuration of the stator in the first embodiment.

First, a configuration of the stator 1 will be described. FIG. 3 is a plan view showing the configuration of the stator 1. FIG. 4 is a side view of the stator 1 as viewed in a direction of an arrow IV in FIG. 3. The stator core 10 is formed by stacking a plurality of electromagnetic steel sheets in the axial direction and fixing the electromagnetic steel sheets together by means of crimping, welding or adhesion.

The stator 1 includes a yoke part 11 in a ring shape about the axis line C1 and a plurality of teeth 12 (see FIG. 6) each extending inward in the radial direction from the yoke part 11. The coils 2 are wound around the teeth 12. Slots accommodating the coils 2 are formed each between adjacent two teeth 12. The number of the teeth 12 (i.e., the number of the slots) is nine in this example. Such a configuration of a motor is referred to as a 9-slot. However, the configuration is not limited to the 9-slot.

The coils 2 are wound around the teeth 12 via the insulator 3. The insulator 3 electrically insulates the teeth 12 and the coils 2 from each other. The insulator 3 is formed by molding thermoplastic resin such as PBT (polybutylene terephthalate) integrally with the stator core 10 or by mounting previously formed molded bodies on the stator core 10, for example. The insulator 3 includes an inner wall part 31 and an outer wall part 32 supporting the coils 2 from an inner side and an outer side in the radial direction, in addition to parts covering peripheries of the teeth 12.

On the outer wall part 32 of the insulator 3, pins 33a and 33b for fixing the first substrate 51 and pins 33c and 33d for fixing the second substrate 52 are formed to project in the axial direction.

The coils 2 are formed by winding magnet wires around the teeth 12, for example. The coils 2 are a three-phase winding and includes a coil 2u (first coil) of a U-phase (first phase), a coil 2v (third coil) of a V-phase (third phase), and a coil 2w (second coil) of a W-phase (second phase). Incidentally, the arrangement of the coil 2u, 2v and 2w shown in FIG. 3 is just an example, and arrangement of the coils is not limited to such arrangement.

On the outer wall part 32 of the insulator 3, a power supply terminal 41u (first terminal) to which the U-phase coil 2u is connected, a power supply terminal 41v (third terminal) to which the V-phase coil 2v is connected, and a power supply terminal 41w (second terminal) to which the W-phase coil 2w is connected. While the power supply terminals 41u, 41v and 41w are arranged at equal intervals around the axis line C1 in this example, the power supply terminals 41u, 41v and 41w are not necessarily arranged at equal intervals.

Further, on the outer wall part 32 of the insulator 3, a neutral point terminal 42 to which the U-phase coil 2u is connected and a neutral point terminal 43 to which the V-phase coil 2v and the W-phase coil 2w are connected are also provided. The neutral point terminal 42 is arranged between the power supply terminals 41u and 41v in the circumferential direction. The neutral point terminal 43 is arranged between the power supply terminals 41v and 41w in the circumferential direction. However, the neutral point terminals 42 and 43 are not limited to such arrangement.

The coil 2u, 2v and 2w of the respective phases are respectively connected to the power supply terminals 41u, 41v and 41w and the neutral point terminals 42 and 43 by means of fusing (heat crimping), soldering or the like.

(Configuration of Lead Wire Group)

As shown in FIG. 2, the lead wire group 7 is attached to the substrate 5 (the first substrate 51 and the second substrate 52) mounted on the stator core 10. The lead wire group 7 includes three power supply lead wires 71 and five sensor lead wires 72.

Figure 5:
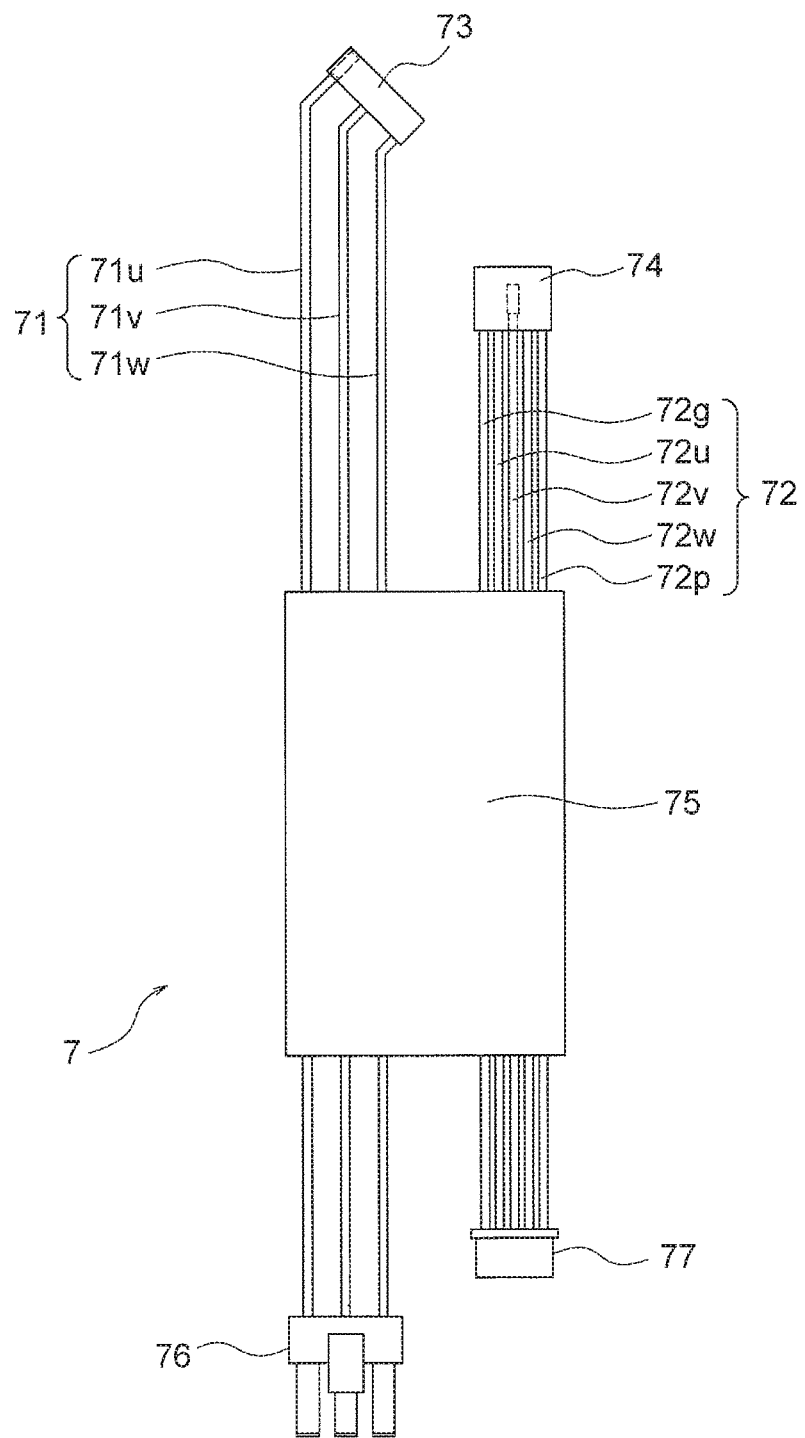
FIG. 5 is a schematic diagram showing a configuration of a lead wire group in the first embodiment.

FIG. 5 is a schematic diagram for explaining a configuration of the lead wire group 7. The power supply lead wires 71 include power supply lead wires 71u, 71v and 71w of the U-phase, V-phase and W-phase. The sensor lead wires 72 include a ground (earth) wiring 72g, sensor lead wires 72u, 72v and 72w for the U-phase, V-phase and W-phase, and a sensor power supply wiring 72p.

A board-in connector 73 (power supply connector) is attached to tip ends of the power supply lead wires 71, while an external connection connector 76 is attached to tail ends of the power supply lead wires 71. A board-in connector 74 (sensor connector) is attached to tip ends of the sensor lead wires 72, while an external connection connector 77 is attached to tail ends of the sensor lead wires 72. The board-in connectors 73 and 74 are connected to the first substrate 51 and the second substrate 52, while the external connection connectors 76 and 77 are connected to an external device or the like. The power supply lead wires 71 and the sensor lead wires 72 are protected from surrounding environment by a protective tube 75.

Incidentally, the three power supply lead wires 71 and the five sensor lead wires 72 are shown in parallel in FIG. 5, but in fact the five sensor lead wires 72 are arranged to overlap with the three power supply lead wires 71 in the axial direction.

With reference to FIG. 2 again, the lead wire group 7 includes a lead wire lead-out part 70 for leading the power supply lead wires 71 and the sensor lead wires 72 to an outside of the stator 1. The lead wire lead-out part 70 is a member having a width in the circumferential direction of the stator core 10 and is mounted between the pins 33c and 33d in the circumferential direction (width direction). The radial direction at a center of the lead wire lead-out part 70 in the width direction will be referred to as a leading direction of the lead wires 71 and 72 (indicated by an arrow A1).

(Arrangement of Coils)

Figure 6:
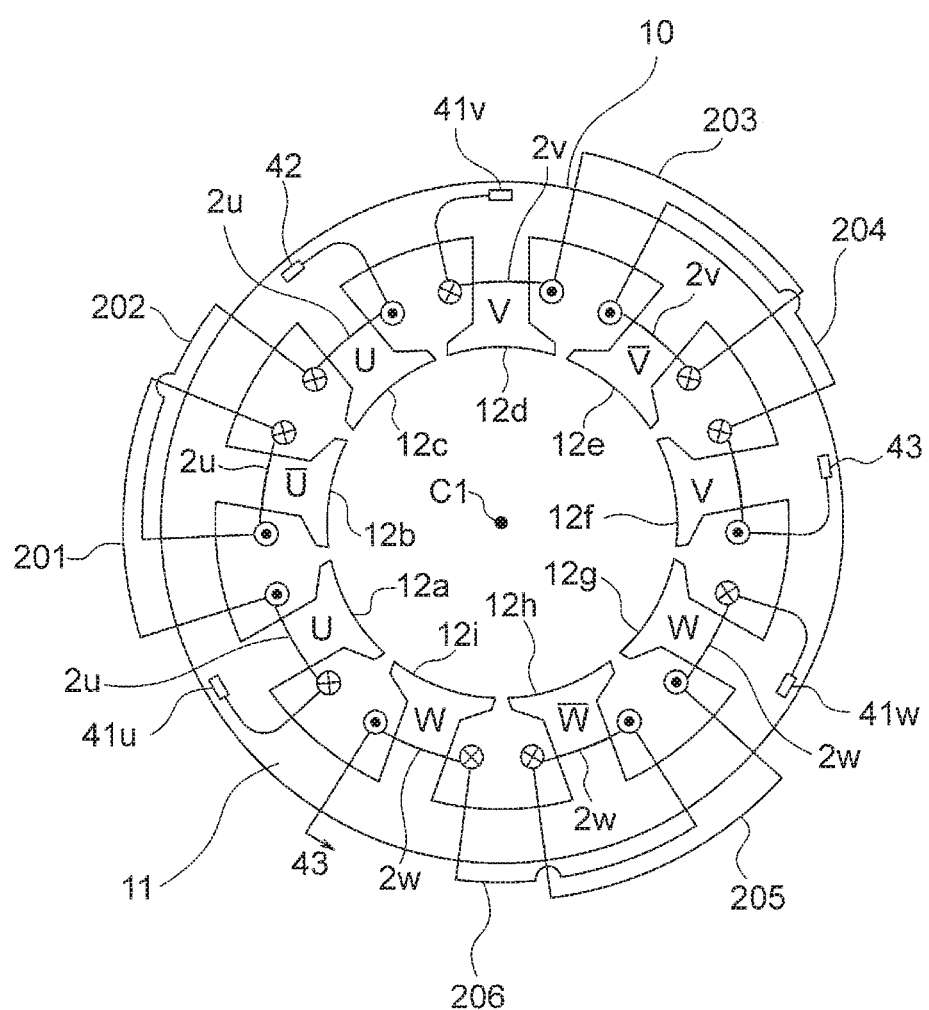
FIG. 6 is a schematic diagram for explaining a winding pattern of coils in the stator in the first embodiment.

FIG. 6 is a schematic diagram for explaining a winding pattern of the coils 2u, 2v and 2w. For convenience of explanation, the nine teeth 12 of the stator 1 will be referred to as teeth 12a, 12b, 12c, 12d, 12e, 12f, 12g, 12h and 12i in a clockwise direction in the figure. While the above-described power supply terminals 41u, 41v and 41w are formed respectively at positions corresponding to the teeth 12a, 12d and 12g, the positions of the power supply terminals 41u, 41v and 41w are not limited to these positions.

Further, among the pins 33a to 33d (FIG. 2) for fixing the first substrate 51 and the second substrate 52 to the stator 1, the pin 33a is arranged on an outer side of the tooth 12b in the radial direction and the pin 33b is arranged on an outer side of the tooth 12e in the radial direction. The pin 33c is arranged on an outer side of the tooth 12h in the radial direction and the pin 33d is arranged on an outer side of the tooth 12i in the radial direction.

The coil 2u is wound around the three teeth 12a, 12b and 12c adjacent to each other in the circumferential direction among the nine teeth 12a to 12i. Further, the coil 2v is wound around the three teeth 12d, 12e and 12f adjacent to each other in the circumferential direction. Further, the coil 2w is wound around the three teeth 12g, 12h and 12i adjacent to each other in the circumferential direction. Winding patterns of the coils 2u, 2v and 2w are as described below.

The coil 2u connected to the power supply terminal 41u is first wound around the tooth 12a, further drawn around via a jumper wire 201 on the outer circumferential side, and wound around the adjacent tooth 12b. The winding direction of the coil 2u around the tooth 12b is opposite to the winding direction of the coil 2u around the tooth 12a. The coil 2u wound around the tooth 12b is further drawn around via a jumper wire 202 on the outer circumferential side and wound around the adjacent tooth 12c. The winding direction of the coil 2u around the tooth 12c is opposite to the winding direction of the coil 2u around the tooth 12b.

Accordingly, current in the coil 2u wound around the tooth 12b has a phase inverted by 180 degrees relative to a phase of current in the coil 2u wound around the tooth 12a or 12c. The coil 2u wound around the tooth 12a or 12c may be referred to as a U-phase and the coil 2u wound around the tooth 12b may be referred to as a U-bar phase.

The coil 2v connected to the power supply terminal 41v is first wound around the tooth 12d, further drawn around via a jumper wire 203 on the outer circumferential side, and wound around the adjacent tooth 12e. The winding direction of the coil 2v around the tooth 12e is opposite to the winding direction of the coil 2v around the tooth 12d. The coil 2v wound around the tooth 12e is further drawn around via a jumper wire 204 on the outer circumferential side and wound around the adjacent tooth 12f. The winding direction of the coil 2v around the tooth 12f is opposite to the winding direction of the coil 2v around the tooth 12e.

Accordingly, current in the coil 2v wound around the tooth 12e has a phase inverted by 180 degrees relative to a phase of current in the coil 2v wound around the tooth 12d or 12f. The coil 2v wound around the tooth 12d or 12f may be referred to as a V-phase and the coil 2v wound around the tooth 12e may be referred to as a V-bar phase.

The coil 2w connected to the power supply terminal 41w is first wound around the tooth 12g, further drawn around via a jumper wire 205 on the outer circumferential side, and wound around the adjacent tooth 12h. The winding direction of the coil 2w around the tooth 12h is opposite to the winding direction of the coil 2w around the tooth 12g. The coil 2w wound around the tooth 12h is further drawn around via a jumper wire 206 on the outer circumferential side and wound around the adjacent tooth 12i. The winding direction of the coil 2w around the tooth 12i is opposite to the winding direction of the coil 2w around the tooth 12h.

Accordingly, current in the coil 2w wound around the tooth 12h has a phase inverted by 180 degrees relative to a phase of current in the coil 2w wound around the tooth 12g or 12i. The coil 2w wound around the tooth 12g or 12i may be referred to as a W-phase and the coil 2w wound around the tooth 12h may be referred to as a W-bar phase.

Figure 7A:
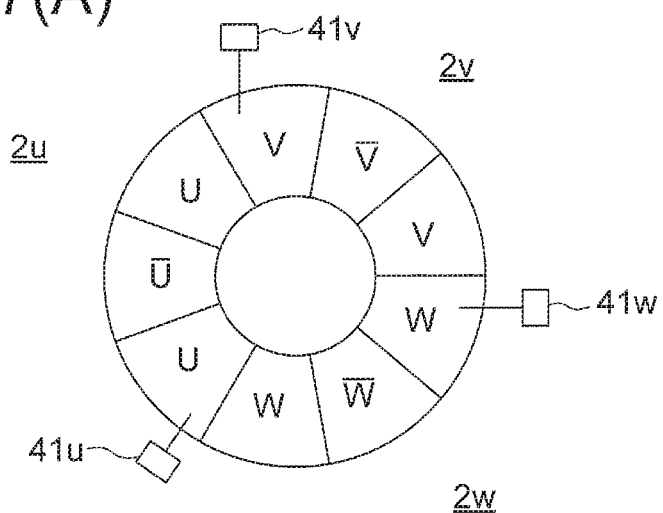
FIGS. 7(A) and 7(B) are schematic diagrams showing the winding pattern of the coils in the stator in the first embodiment in contrast to a comparative example.

FIG. 7(A) is a schematic diagram showing arrangement of the coils 2u, 2v and 2w in the first embodiment. In this example, the coils 2u of the U-phase, U-bar phase and U-phase, the coils 2v of the V-phase, V-bar phase and V-phase, and the coils 2w of the W-phase, W-bar phase and W-phase are arranged in the clockwise direction in the figure. Such arrangement of the coils is often employed for 8-pole 9-slot motors and 10-pole 9-slot motors, for example. Meanwhile, in such arrangement of the coils, the power supply terminals 41u, 41v and 41w for the coils 2u, 2v and 2w are arranged dispersedly in the circumferential direction.

Figure 7B:
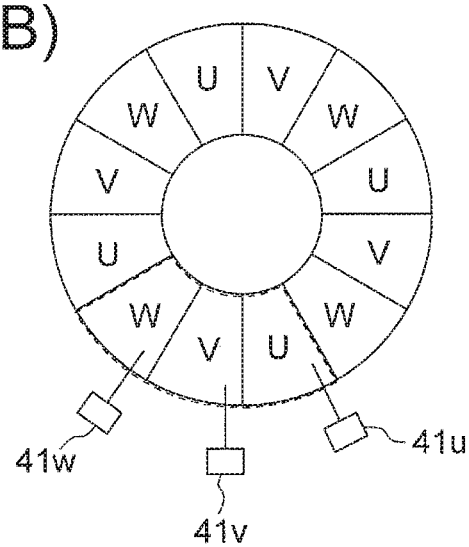

FIG. 7(B) is a schematic diagram showing arrangement of the coils 2u, 2v and 2w in a comparative example in contrast to the first embodiment. In this comparative example, the number of teeth 12 is twelve (referred to also as 12-slot). In this case, the coils 2u, 2v and 2w of the U-phase, V-phase and W-phase are in turn wound around three teeth 12 adjacent to each other in the circumferential direction, and four sets of such three teeth 12 are provided. In the arrangement of the coils shown in FIG. 7(B), the power supply terminals 41u, 41v and 41w for the coils 2u, 2v and 2w are arranged at positions close to each other.

In the arrangement shown in FIG. 7(A), the power supply terminals 41u, 41v and 41w for the coils 2u, 2v and 2w are arranged dispersedly in the circumferential direction as described above. Therefore, if power supply wirings 6u, 6v and 6w (described later) connected to the power supply terminals 41u, 41v and 41w are mounted on a single substrate, the substrate is necessarily large in size. The number of such large-sized and ring-shaped substrates obtainable from a substrate base material in a manufacturing process is limited and thus it is difficult to reduce the manufacturing cost.

This embodiment is intended to reduce the manufacturing cost in the configuration in which the power supply terminals 41u, 41v and 41w of the respective phases are arranged dispersedly in the circumferential direction as described above (for example, 8-pole 9-slot, 10-pole 9-slot or the like).

(Configuration of Substrates)

Configurations of the first substrate 51 and the second substrate 52 will be explained. This explanation will be given on the assumption that the coils 2u, 2v and 2w of the U-phase, V-phase and W-phase are arranged as shown in FIG. 3 and FIG. 6. However, the arrangement of the coils 2u, 2v and 2w may be modified freely and configurations of the substrates 51 and 52 may also be modified accordingly.

As shown in FIG. 2, the first substrate 51 and the second substrate 52 constituting the substrate 5 are mounted on one end part (top part) of the stator 1 in the axial direction. The first substrate 51 is arranged in a range covering the power supply terminals 41u and 41v. The second substrate 52 is arranged in a range covering the power supply terminal 41w. In the example shown in FIG. 2, the first substrate 51 is arranged in a range covering the teeth 12a to 12e (FIG. 6) and the second substrate 52 is arranged in a range covering the teeth 12g to 12i (FIG. 6). However, the first substrate 51 and the second substrate 52 are not limited to such configurations.

The substrates 51 and 52 extend in the circumferential direction and are combined together at the connection part 53 (separation surface). In the example shown in FIG. 2, the connection part 53 is formed at a position corresponding to between the teeth 12a and 12i (FIG. 6). However, the position of the connection part 53 is not limited to this position. The board-in connector 73 is mounted to straddle the connection part 53 between the substrates 51 and 52.

The first substrate 51 includes a terminal insertion hole 5u in which the power supply terminal 41u is inserted and a terminal insertion hole 5v in which the power supply terminal 41v is inserted. The first substrate 51 further includes a power supply wiring 6u connecting to the terminal insertion hole 5u and a power supply wiring 6v connecting to the terminal insertion hole 5v. Each of the power supply wirings 6u and 6v is an electrically conductive pattern (for example, a copper foil) formed on a back surface of the first substrate 51 (a surface on the stator 1 side).

The power supply wiring 6u is electrically connected to the power supply terminal 41u inserted in the terminal insertion hole 5u and supplies electric power to the coil 2u. The power supply wiring 6v is electrically connected to the power supply terminal 41v inserted in the terminal insertion hole 5v and supplies electric power to the coil 2v.

The first substrate 51 further includes engagement holes 5a and 5b respectively engaging with the pins 33a and 33b of the stator 1. The pins 33a and 33b are thermally welded in a state where the pins 33a and 33b engage with the holes 5a and 5b, and thus the first substrate 51 is fixed to the stator 1.

The second substrate 52 includes a terminal insertion hole 5w in which the power supply terminal 41w is inserted. The second substrate 52 further includes a power supply wiring 6w connecting to the terminal insertion hole 5w. The power supply wiring 6w is an electrically conductive pattern (for example, a copper foil) formed on a back surface of the second substrate 52 (a surface on the stator 1 side). The power supply wiring 6w is electrically connected to the power supply terminal 41w inserted in the terminal insertion hole 5w and supplies electric power to the coil 2w.

The second substrate 52 further includes engagement holes 5c and 5d respectively engaging with the pins 33c and 33d of the stator 1. The pins 33c and 33d are thermally welded in the state where the pins 33c and 33d engage with the engagement holes 5c and 5d, and thus the second substrate 52 is fixed to the stator 1.

Figure 8:
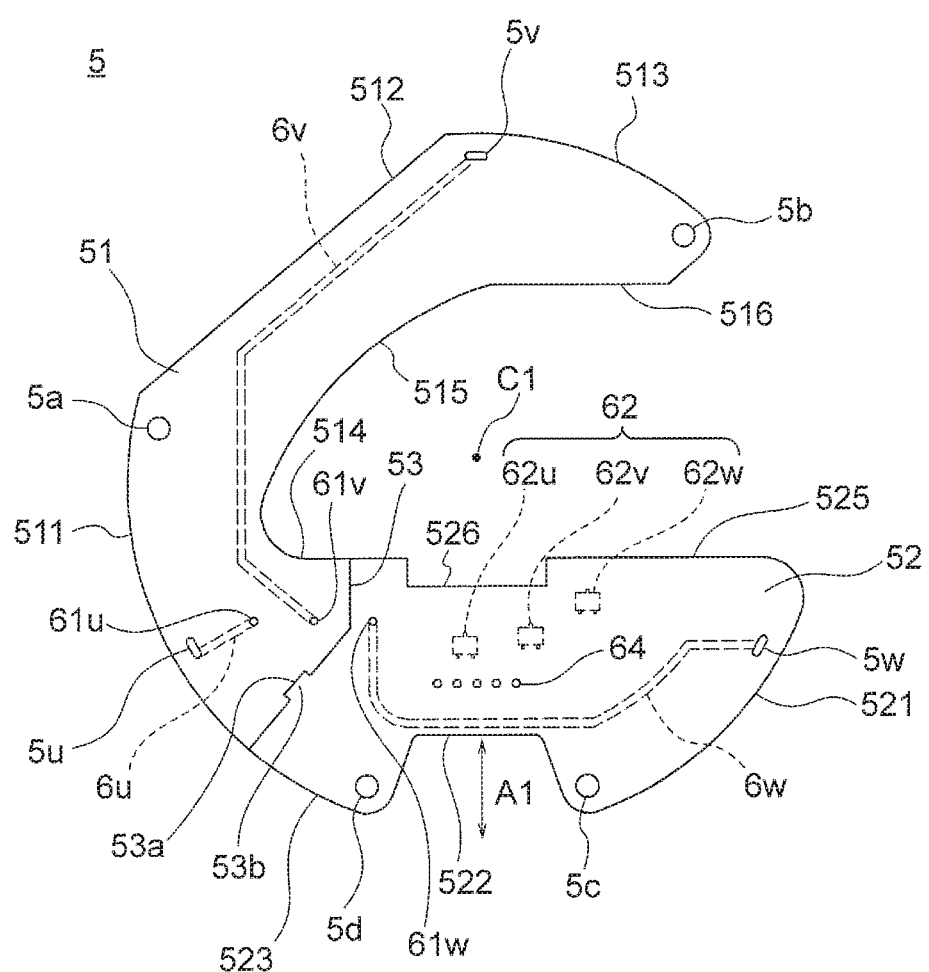
FIG. 8 is a plan view showing a first substrate and a second substrate in the first embodiment.

FIG. 8 is a plan view showing the configurations of the substrates 51 and 52. The connection part 53 between the substrates 51 and 52 extends inward in the radial direction from an edge part of the substrates 51 and 52 on the outer circumferential side, changes its direction at a position where the connection part 53 passes an edge part of the stator core 10 on the inner circumferential side, extends in the above-described leading direction of the lead wires 71 and 72 (the direction indicated by the arrow A1), and reaches an edge part of the substrates 51 and 52 on the inner circumferential side. Incidentally, a position where the connection part 53 is formed is not limited to the position shown in FIG. 8, and it is sufficient that the connection part 53 is formed at a position where the substrates 51 and 52 can be separated without interfering with the power supply wirings 6u, 6v and 6w.

The connection part 53 includes a concave part 53a formed on the first substrate 51 and a convex part 53b formed on the second substrate 52. The concave part 53a and the convex part 53b engage with each other, and thus the substrates 51 and 52 are connected together. The concave part 53a and the convex part 53b constitute an engagement part (first connection part). Incidentally, it is also possible to form a convex part on the first substrate 51 and a concave part on the second substrate 52. Further, the substrates 51 and 52 may have any forms engaging with each other, not limited to a combination of the concave part and the convex part.

On the first substrate 51, a connection terminal part 61u of the power supply wiring 6u (first connection terminal part) and a connection terminal part 61v of the power supply wiring 6v (third connection terminal part) are arranged in a region between the connection part 53 and the terminal insertion hole 5u. The connection terminal part 61u is located above the tooth 12a (FIG. 6), for example. The connection terminal part 61v is arranged between the connection terminal part 61u and the connection part 53, for example. Further, a connection terminal part 61w of the power supply wiring 6w (second connection terminal part) is arranged at a position facing the connection terminal part 61v across the connection part 53.

The connection terminal parts 61u, 61v and 61w are arranged in a row in a direction perpendicular to the aforementioned leading direction of the lead wires 71 and 72 (the direction indicated by the arrow A1). The aforementioned board-in connector 73 (FIG. 5) is joined to these connection terminal parts 61u, 61v and 61w. Thus, the U-phase, V-phase and W-phase currents respectively flow from the power supply lead wires 71u, 71v and 71w to the power supply wirings 6u, 6v and 6w via the connection terminal parts 61u, 61v and 61w and are supplied to the power supply terminals 41u, 41v and 41w.

On the back surface of the second substrate 52 (the surface on the stator 1 side), a Hall effect sensors (Hall ICs) 62 are arranged along an inner circumference of the stator core 10 (FIG. 3). The Hall effect sensors 62 are used to detect a rotational position of a rotor 8, and include Hall effect sensors 62u, 62v and 62w for the U-phase, V-phase and W-phase.

The second substrate 52 is provided with a connection terminal part 64 in a region between the engagement holes 5c and 5d in the circumferential direction. The connection terminal part 64 is connected to the Hall effect sensors 62u, 62v and 62w by not shown wiring parts. The connection terminal part 64 has five terminal parts, to which the above-described board-in connector 74 (FIG. 5) is joined. Thus, voltages are applied to the Hall effect sensors 62u, 62v and 62w via the ground wiring 72g and the sensor power supply wiring 72p. Output voltages of the Hall effect sensors 62u, 62v and 62w are outputted to an external device via the sensor lead wires 72u, 72v and 72w.

An edge part of the first substrate 51 on the outer circumferential side includes outer circumferential arc parts 511 and 513 extending arcuately along an outer circumference of the stator core 10 and an outer circumferential straight part 512 extending straight to form a chord between the outer circumferential arc parts 511 and 513. The outer circumferential arc part 511 extends from the connection part 53 to a position where the engagement hole 5a is formed. The outer circumferential straight part 512 extends in parallel with the above-described power supply wiring 6v. The outer circumferential arc part 513 extends from a position where the terminal insertion hole 5v is formed to a position where the engagement hole 5b is formed.

An edge part of the first substrate 51 on the inner circumferential side includes an inner circumferential straight part 514 formed to be continuous with the connection part 53, an inner circumferential arc part 515 formed to be continuous with the inner circumferential straight part 514, and an inner circumferential straight part 516 formed to be continuous with the inner circumferential arc part 515. The inner circumferential straight parts 514 and 516 extend in the direction perpendicular to the above-described leading direction of the lead wires 71 and 72 (the arrow A1).

An edge part of the second substrate 52 on the outer circumferential side includes an outer circumferential arc part 521 extending arcuately along the outer circumference of the stator core 10 and a groove-shaped part 522 formed in a middle of the outer circumferential arc part 521. The groove-shaped part 522 is arranged between the engagement holes 5c and 5d in the circumferential direction. A position where the groove-shaped part 522 is formed corresponds to a position where the board-in connector 74 is attached.

An edge part of the second substrate 52 on the inner circumferential side includes an inner circumferential straight part 525 parallel with and facing the inner circumferential straight part 516 of the first substrate 51 and a groove-shaped part 526 formed in the inner circumferential straight part 525. The groove-shaped part 526 is formed at a position facing the above-described groove-shaped part 522. The inner circumferential straight part 525 of the second substrate 52 and the inner circumferential straight part 514 of the first substrate 51 extend on the same straight line in the direction perpendicular to the leading direction of the lead wires 71 and 72 (the arrow A1).

Among the above-described power supply wirings 6u, 6v and 6w, the power supply wiring 6u is the shortest and extends in the radial direction from the terminal insertion hole 5u to the connection terminal part 61u. The power supply wiring 6v is the longest, extends in parallel with the outer circumferential straight part 512 from the terminal insertion hole 5v, bends and then extends straight in a region between the outer circumferential arc part 511 and the inner circumferential arc part 515, bends further and extends straight to the connection terminal part 61v. The power supply wiring 6w extends in parallel with the inner circumferential straight part 525 from the terminal insertion hole 5w, then detours outward in the radial direction, extends straight between the connection terminal part 64 and the groove-shaped part 522, further changes its direction to be in parallel with the leading direction of the lead wires 71 and 72 (the arrow A1), and reaches the connection terminal part 61w.

Figure 9:
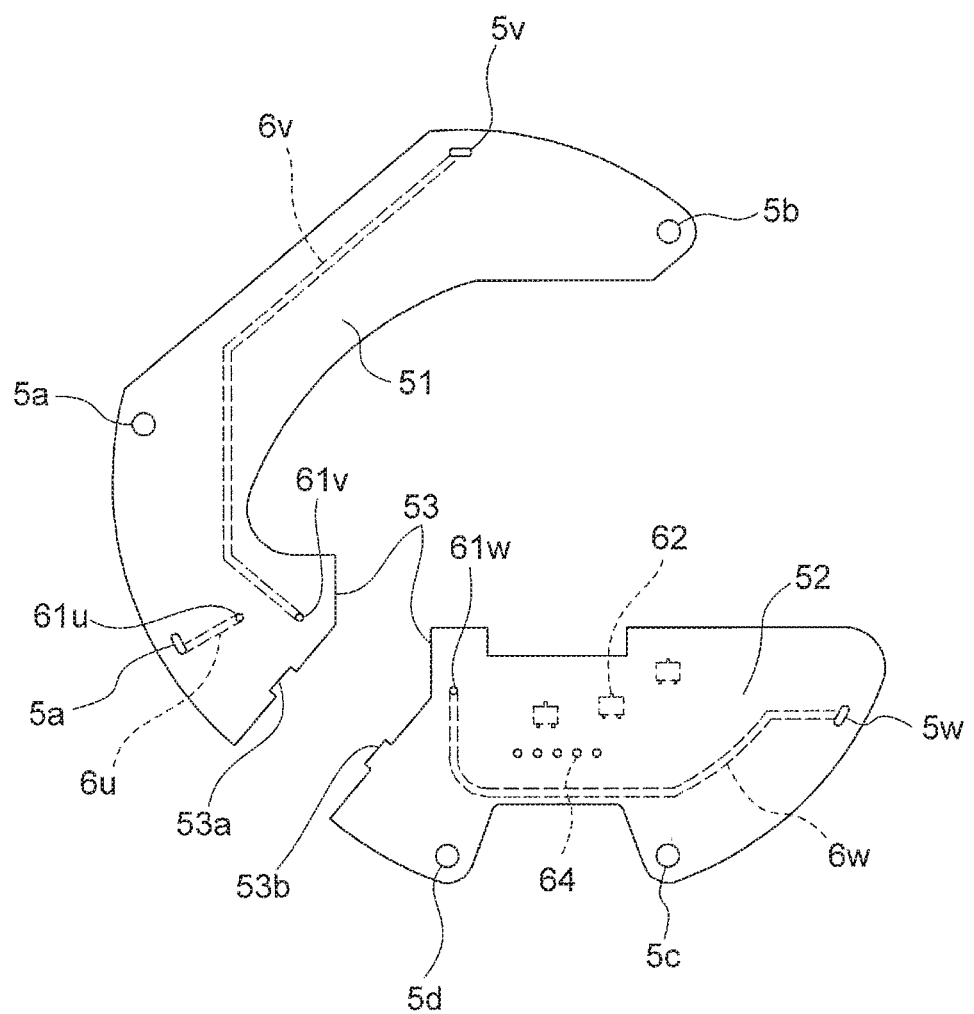
FIG. 9 is a plan view showing the first substrate and the second substrate in the first embodiment in a separated state.

FIG. 9 is a diagram showing a state in which the first substrate 51 and the second substrate 52 are separated. Both of the separated first substrate 51 and second substrate 52 have small dimensions in the radial direction. Therefore, in the manufacturing process, the numbers of the substrates 51 and 52 obtainable from the substrate base material can be increased by forming a plurality of first substrates 51 and a plurality of second substrates 52 to be arranged in a staggered manner in the substrate base material, and punching the substrates 51 and 52 from the substrate base material.

(Configuration of Motor)

Figure 10:
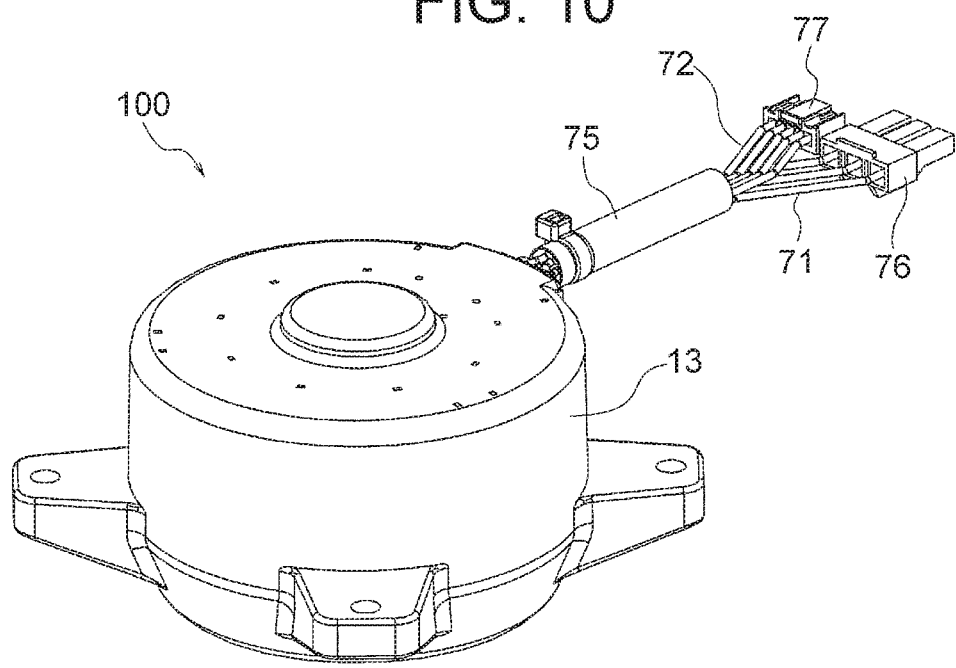
FIG. 10 is a perspective view showing a configuration of a motor in the first embodiment.
Figure 11:
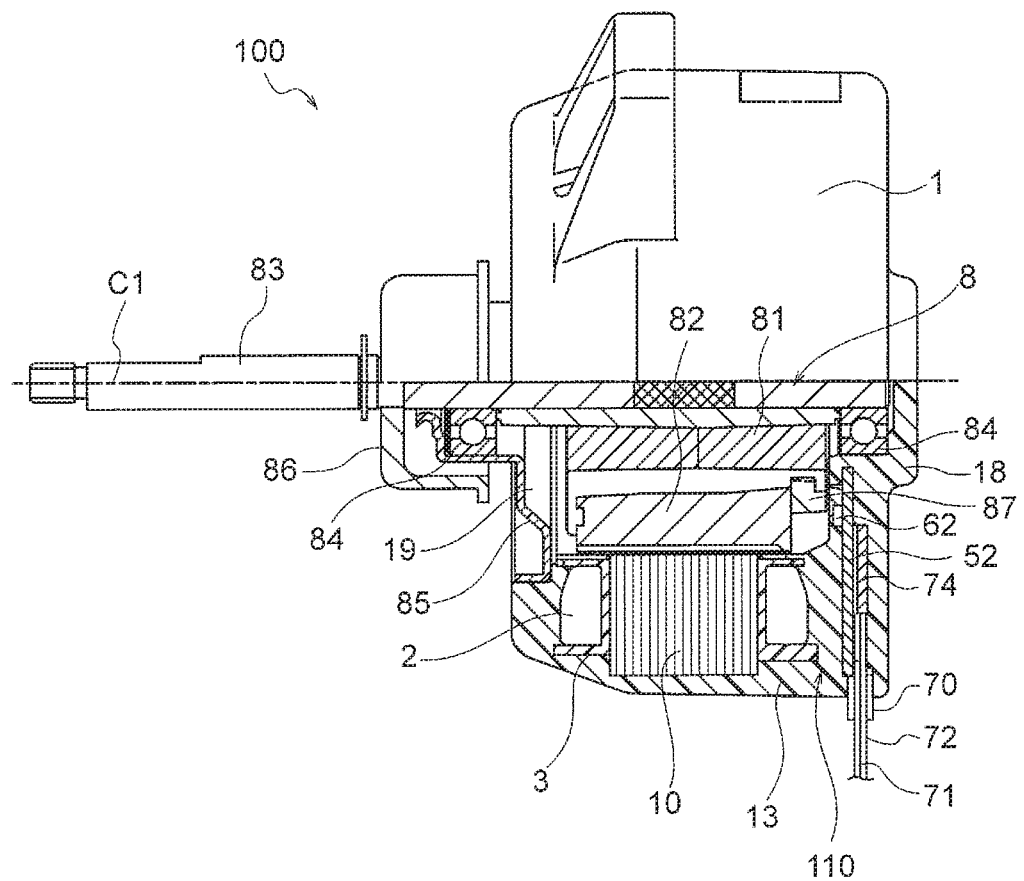
FIG. 11 is a partially sectional view showing the configuration of the motor in the first embodiment.

FIG. 10 is a perspective view showing an external shape of a motor 100 (referred to also as a mold motor) including the stator 1. FIG. 11 is a partially sectional view showing a configuration of the motor 100. The motor 100 includes the stator assembly 110 having the stator 1, a mold resin 13 covering the stator assembly 110, and the rotor 8 rotatably arranged inside the stator 1.

The mold resin 13 is thermosetting resin such as bulk molding compound (BMC), for example. However, the mold resin 13 is not limited to thermosetting resin, but may be thermoplastic resin, for example. The mold resin 13 covers the stator 1 from outside in the radial direction and both sides in the axial direction in such a manner that the inner circumferential surface of the stator 1 is exposed.

As shown in FIG. 11, an end part 18 of the stator 1 in the axial direction on the side to which the substrate 5 (the first substrate 51 and the second substrate 52) is attached is covered with the mold resin 13. However, a part of the lead wire lead-out part 70 is exposed. An opening part 19 is formed in an end part of the stator assembly 110 in the axial direction on the side opposite to the substrate 5.

The rotor 8 is inserted through the opening part 19 of the stator 1 and then faces inner circumferential ends of the teeth 12 of the stator 1. The rotor 8 includes a rotor core 81 in a cylindrical shape and formed of a stack of electromagnetic steel sheets, a plurality of magnets 82 embedded in the rotor core 81, and a shaft 83 penetrating a center of the rotor core 81. A central axis line of the shaft 83 coincides with the above-described axis line C1. The magnets 82 are arranged at equal intervals in the circumferential direction of the rotor core 81. The number of the magnets 82 is eight or ten, for example.

A sensor magnet 87 is attached to the magnets 82 on the substrate 5 side (the right side in FIG. 11). Each of the Hall effect sensors 62 attached to the second substrate 52 is arranged to face the sensor magnet 87 at a position shifted in the radial direction from the sensor magnet 87. The Hall effect sensors 62 detect magnetic flux from the sensor magnet 87 and thereby detect a rotational position of the rotor 8.

The shaft 83 of the rotor 8 is supported by a pair of bearings 84. One of the bearings 84 is held by the mold resin 13 at the end part 18 of the stator 1. The other of the bearings 84 is held by a bracket 85 provided in the opening part 19 of the stator 1.

(Manufacturing Process of Motor)

A manufacturing process of the motor 100 is as described below. First, the insulator 3 is formed by molding thermoplastic resin integrally with the stator core 10 formed of the stack of electromagnetic steel sheets or by mounting previously molded thermoplastic resin on the stator core 10. Further, the coils 2u, 2v and 2w are wound around the teeth 12a to 12i of the stator core 10 as shown in FIG. 6 via the insulator 3. Thus, the stator 1 is completed.

Further, one substrate 5 is formed by combining the first substrate 51 and the second substrate 52 together at the connection part 53 and engaging the concave part 53a and the convex part 53b with each other, and the lead wire group 7 is connected to the substrate 5. Specifically, the board-in connector 73 is joined to the connection terminal parts 61u, 61v and 61w and the board-in connector 74 is joined to the connection terminal part 64.

The substrate 5 (the first substrate 51 and the second substrate 52) to which the lead wire group 7 is connected as above is mounted on the stator 1. In this step, the pins 33a to 33d of the stator 1 are respectively engaged with the engagement holes 5a, 5b, 5c and 5d of the substrates 51 and 52 and thermally welded.

Further, the power supply terminals 41u, 41v and 41w of the stator 1 are engaged with the terminal insertion holes 5u, 5v and 5w of the substrates 51 and 52 and connected to the power supply wirings 6u, 6v and 6w by means of soldering or the like. Thus, the stator assembly 110 is completed.

Thereafter, the stator assembly 110 is molded with mold resin such as BMC. Specifically, the stator assembly 110 is set in a mold and the mold resin is injected into the mold. In a case where thermosetting resin is used as the mold resin, the mold resin is cured by heating the mold. Thus, the stator assembly 110 is covered with the mold resin. Incidentally, as described above, the mold resin is not limited to thermosetting resin and may be thermoplastic resin, for example.

After this molding step, the motor 100 is assembled. Specifically, the bearings 84 are attached to the shaft 83 of the rotor 8, and the rotor 8 is inserted through the opening part 19 of the stator 1. Further, the bracket 85 is attached to the opening part 19 of the stator 1. Furthermore, a waterproof cap 86 inhibiting intrusion of water or the like into the bearings 84 is attached to an outer side of the bracket 85. Thus, the manufacture of the motor 100 is completed.

(Configuration of Air Conditioner)

Figure 12:
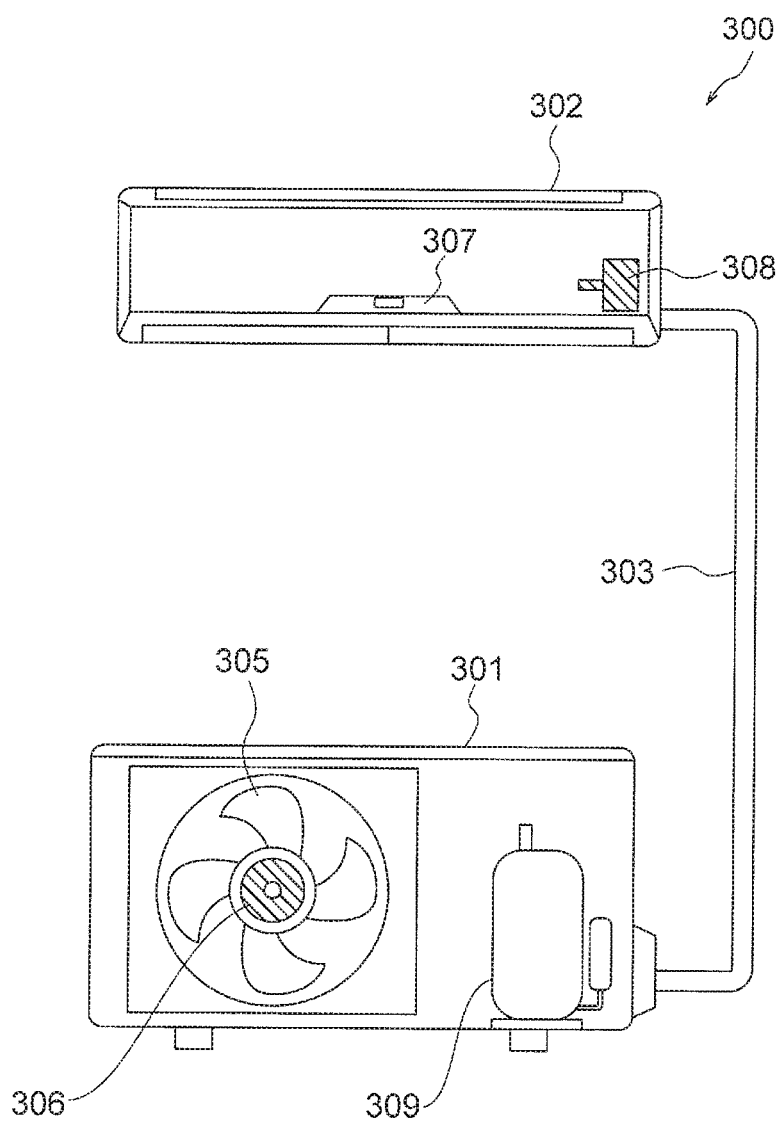
FIG. 12 is a diagram showing a configuration example of an air conditioner equipped with the motor in the first embodiment.

Next, an air conditioner 300 including the motor 100 in this embodiment will be described. FIG. 12 is a diagram showing a configuration example of the air conditioner 300. The air conditioner 300 includes an outdoor unit 301, an indoor unit 302, and a refrigerant pipe 303 connecting the outdoor unit 301 and the indoor unit 302.

The outdoor unit 301 includes a first fan (blower) 305 and a first motor 306 driving the first fan 305. The indoor unit 302 includes a second fan 307 and a second motor 308 driving the second fan 307. At least one of the first motor 306 and the second motor 308 is formed of the motor 100 in this embodiment. Incidentally, a compressor 309 compressing refrigerant in the outdoor unit 301 is also shown in FIG. 12.

For example, in a case where the first motor 306 is constituted by the motor 100 (FIG. 11) in this embodiment, as the rotor 8 (FIG. 11) of the motor 100 rotates, the first fan 305 rotates and blows air to an outside of the room. Heat emitted when the refrigerant compressed by the compressor 309 is condensed in a condenser (not shown) is discharged to the outside of the room by the air blown out by the first fan 305.

Effects of Embodiment

As described above, in the first embodiment of the present invention, the substrate 5 to be mounted on the stator 1 is separated into the first substrate 51 and the second substrate 52, the first substrate 51 includes the first power supply wiring (for example, the power supply wiring 6u), and the second substrate 52 includes the second power supply wiring (for example, the power supply wiring 6w). Therefore, the substrates 51 and 52 can be configured to be small in size even in a case where the power supply terminals 41u, 41v and 41w are arranged apart from each other. Accordingly, the numbers of the substrates 51 and 52 obtainable from the substrate base material can be increased and the manufacturing cost can be reduced.

Further, since the first substrate 51 and the second substrate 52 are connected together by the engagement of the concave part 53a and the convex part 53b (engagement part), mounting position accuracy of the substrates 51 and 52 with respect to the stator 1 and rigidity of the substrates 51 and 52 can be increased and performance of the motor 100 can be enhanced. Further, the manufacturing process can be simplified since the substrates 51 and 52 can be handled as one substrate 5.

Further, since the first substrate 51 includes the power supply wirings 6u and 6v for two phases (for example, the U-phase and the V-phase) and the second substrate 52 includes the power supply wiring 6w for the remaining one phase (for example, the W-phase), the electric power supply to the power supply terminals 41u, 41v and 41w of the U-phase, V-phase and W-phase can be carried out without enlarging the substrates 51 and 52.

Further, the first substrate 51 has the terminal insertion holes 5u and 5v in which the power supply terminals 41u and 41v are inserted and the second substrate 52 has the terminal insertion hole 5w in which the power supply terminal 41w is inserted. Therefore, the power supply wirings 6u, 6v and 6w can be electrically connected to the power supply terminals 41u, 41v and 41w, respectively.

Further, since the board-in connector 73 (power supply connector) is joined to the connection terminal parts 61u and 61v of the first substrate 51 and the connection terminal part 61w of the second substrate 52, electric power supply to the coils 2u, 2v and 2w of the respective phases can be carried out using one board-in connector 73 and the manufacturing cost can be reduced further. It is also possible to make the board-in connector 73 have a role to connect the first substrate 51 and the second substrate 52 together.

Further, since the first substrate 51 has the engagement holes 5a and 5b engaging with the pins 33a and 33b and the second substrate 52 has the engagement holes 5c and 5d engaging with the pins 33c and 33d, the mounting position accuracy of the substrates 51 and 52 with respect to the stator 1 can be increased further.

Further, since the second substrate 52 includes the Hall effect sensors 62, it is possible to make the Hall effect sensors 62 face the sensor magnet 87 without enlarging the substrates 51 and 52. Further, since the board-in connector 74 is connected to the connection terminal part 64 of the second substrate 52, output signals of the Hall effect sensors 62 can be taken out with a simple configuration.

Further, by employing the above-described motor 100 as a drive source of the fan of the air conditioner 300, the manufacturing cost of the air conditioner 300 can be reduced.

Second Embodiment

Figure 13A:
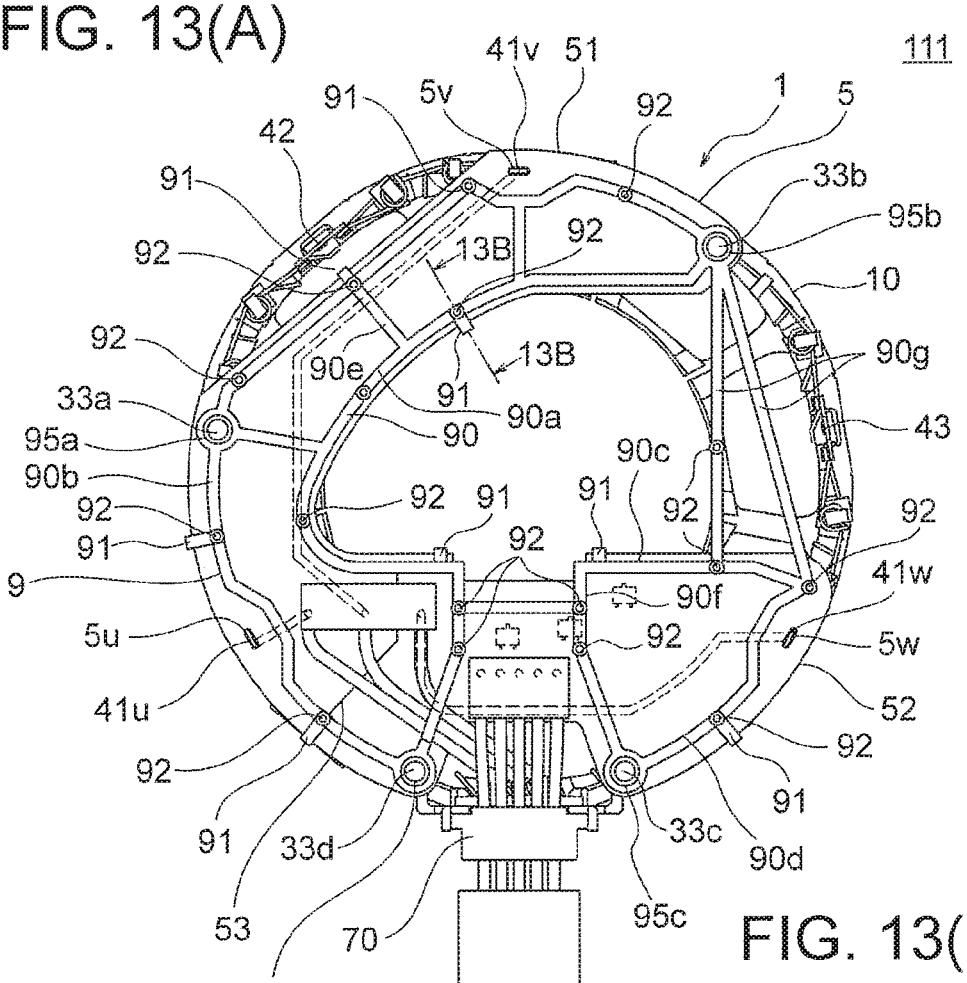
FIG. 13(A) is a plan view showing a configuration of a stator assembly in a second embodiment of the present invention.

Next, a second embodiment of the present invention will be described. FIG. 13(A) is a plan view showing a stator assembly 111 in the second embodiment. In this second embodiment, the first substrate 51 and the second substrate 52 are connected together using a substrate retaining member 9 arranged on the first substrate 51 and the second substrate 52.

(Configuration of Substrate Retaining Member)

The substrate retaining member (connection member) 9 includes a plurality of ribs 90 extending in the form of a framework in a plane perpendicular to the axial direction and a plurality of projections 92 each projecting from the rib 90 toward an opposite side to the stator 1 (the upper side in FIG. 1). The substrate retaining member 9 is formed of resin such as PBT, for example.

The ribs 90 include a rib 90a extending along an edge part of the first substrate 51 on the inner circumferential side, a rib 90b extending along an edge part of the first substrate 51 on the outer circumferential side, a rib 90c extending along an edge part of the second substrate 52 on the inner circumferential side, and a rib 90d extending along an edge part of the second substrate 52 on the outer circumferential side. The ribs 90 further include a rib 90e connecting the ribs 90a and 90b together in the radial direction and a rib 90f connecting the ribs 90c and 90d together in the radial direction. The ribs 90 further include ribs 90g connecting the ribs 90a and 90b on the first substrate 51 and the ribs 90c and 90d on the second substrate 52 together. Incidentally, the shape of the ribs 90 is not limited to the shape described here, and any shape capable of retaining the whole of the first substrate 51 and the second substrate 52 from above (the side opposite to the stator 1 side) may be employed.

The projections 92 are arranged in a great number throughout the whole of the ribs 90a to 90g. Further, holding parts 91 for holding the first substrate 51 are formed on the ribs 90a and 90b on the inner and outer circumferential sides of the first substrate 51. Similarly, holding parts 91 for holding the second substrate 52 are formed on the ribs 90c and 90d on the inner and outer circumferential sides of the second substrate 52.

Figure 13B:
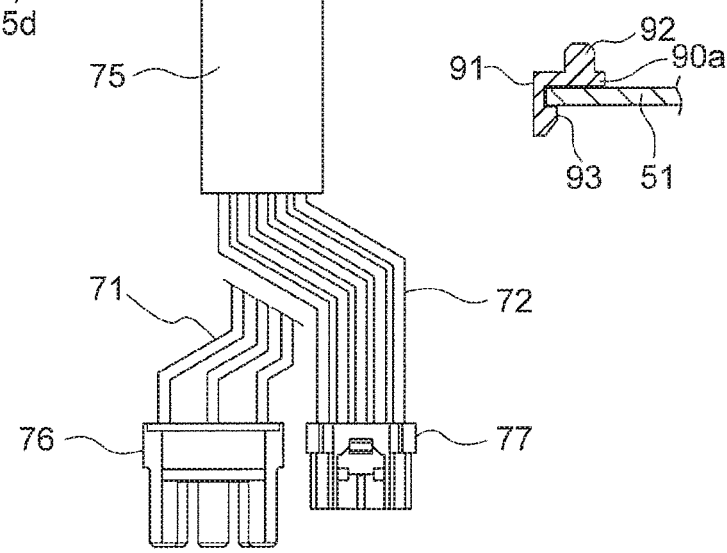
FIG. 13(B) is an enlarged sectional view showing a part of the stator assembly.

FIG. 13(B) is a diagram schematically showing a configuration of the holding part 91, which corresponds to a sectional view at a line segment 13B-13B shown in FIG. 13(A) as viewed in a direction of arrows. The holding part 91 extends downward, i.e., toward the stator 1, from the rib 90 (the rib 90a in this example) and has a hook part (locking part) 93 at its lower end. The hook part 93 is configured to contact a lower surface of the first substrate 51 (the surface facing the stator 1). While the holding part 91 holding the first substrate 51 is shown in FIG. 13(B), the holding part 91 holding the second substrate 52 is also configured in the same way.

Accordingly, when the substrate retaining member 9 is attached onto the first substrate 51 and the second substrate 52, the holding parts 91 of the substrate retaining member 9 hold the first substrate 51 and the second substrate 52. Namely, the first substrate 51 and the second substrate 52 are connected together by the substrate retaining member 9.

The substrate retaining member 9 has engagement holes 95a, 95b, 95c and 95d at positions corresponding to the pins 33a, 33b, 33c and 33d of the stator 1. The pins 33a, 33b, 33c and 33d of the stator 1 engage with the engagement holes 5a, 5b, 5c and 5d of the first substrate 51 and the second substrate 52 and further engage with the engagement holes 95a, 95b, 95c and 95d of the substrate retaining member 9.

Incidentally, while the holding part 91 shown in FIG. 13(B) is formed in a part of the rib 90 where the projection 92 is arranged, the holding part 91 may be formed at a position separate from the projection 92.

In this second embodiment, the first substrate 51 and the second substrate 52 are connected together using the substrate retaining member 9, and thus it is unnecessary to provide the engagement part (the concave part 53a and the convex part 53b) described in the first embodiment. However, it is also possible to provide the engagement part (the concave part 53a and the convex part 53b) in addition to using the substrate retaining member 9.

The rest of the configuration of the motor in the second embodiment is substantially the same as that in the first embodiment. The motor in the second embodiment can be employed for the air conditioner 300 described with reference to FIG. 12, for example.

(Manufacturing Process of Motor)

In the manufacturing process of the motor in this second embodiment, the first substrate 51 and the second substrate 52 are individually mounted on the stator 1 and thereafter the substrate retaining member 9 is attached onto the first substrate 51 and the second substrate 52. In this case, the holding parts 91 (the hook parts 93) of the substrate retaining member 9 hold the first substrate 51 and the second substrate 52 as shown in FIG. 13(B), and thus the first substrate 51 and the second substrate 52 are connected together. Incidentally, it is also possible to first integrate the first substrate 51 and the second substrate 52 together by attaching the substrate retaining member 9 and thereafter mount the integrated substrate 5 on the stator 1.

Thereafter, the substrate 5 and the substrate retaining member 9 are fixed to the stator 1 by thermally welding the pins 33a, 33b, 33c and 33d penetrating the engagement holes 5a, 5b, 5c and 5d of the substrate 5 and the engagement holes 95a, 95b, 95c and 95d of the substrate retaining member 9. Thus, the stator assembly 111 shown in FIG. 13(A) is obtained.

Figure 14:
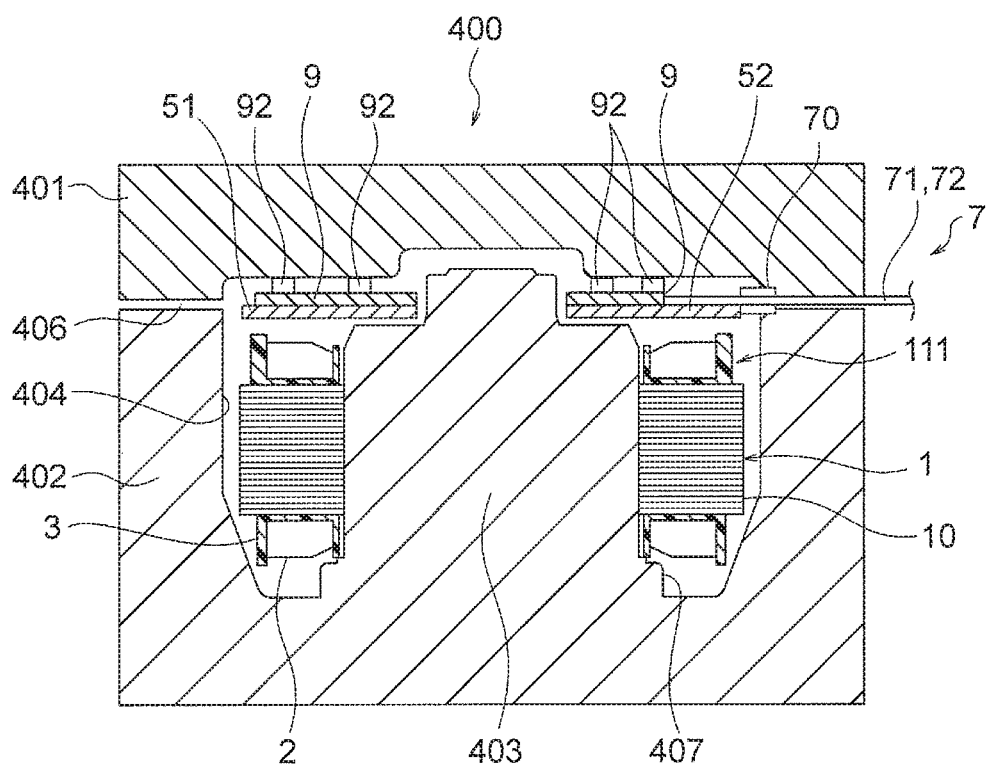
FIG. 14 is a schematic diagram showing the stator assembly and a mold in the second embodiment.

FIG. 14 is a schematic diagram for explaining a configuration of a mold 400 used in a mold step in the second embodiment. The mold 400 is configured to include an upper mold 401 and a lower mold 402 which are openable and closable, and a cavity 404 is formed between the upper mold 401 and the lower mold 402. A runner 406 as a channel for injecting resin into the cavity 404 is formed between the upper mold 401 and the lower mold 402. The runner 406 is connected to an upper end part of the cavity 404.

A center core 403 in a cylindrical shape is formed in the lower mold 402, and the center core 403 projects toward an inside of the cavity 404. The center core 403 is a part engaging with an inner surface of the stator core 10. A larger-diameter part 407 projecting outward in the radial direction from the center core 403 is formed at a lower end part of the center core 403. This larger-diameter part 407 is a part corresponding to the opening part 19 (FIG. 11) of the stator 1.

At the time of molding, the cavity 404 is opened by moving the upper mold 401 upward, and the stator assembly 111 (including the stator 1, the substrate 5 and the substrate retaining member 9) is set in the cavity 404. A part of the lead wire lead-out part 70, parts of the power supply lead wires 71 and parts of the sensor lead wires 72 project to an outside of the cavity 404.

Thereafter, the cavity 404 is closed by moving the upper mold 401 downward, and the mold resin in a molten state is injected into the cavity 404 through the runner 406. The mold resin injected into the cavity 404 covers the stator assembly 111.

In a case where thermosetting resin is used as the mold resin, the stator assembly 111 is molded by injecting the mold resin into the cavity 404 and thereafter curing the mold resin in the cavity 404 by heating the mold 400. As described above, the mold resin is not limited to thermosetting resin and may be thermoplastic resin, for example. At the time of molding, the projections 92 of the substrate retaining member 9 are in contact with a top surface of the cavity 404, and thus deformation of the substrate 5 (the first substrate 51 and the second substrate 52) due to molding pressure is inhibited. Incidentally, it is also possible that lower surfaces of the hook parts 93 (FIG. 13(B)) of the holding parts 91 of the substrate retaining member 9 are in contact with the mold 400.

Thereafter, the molded stator assembly 111 is taken out of the mold 400, and the rotor 8 is mounted in the stator 1 of the stator assembly 111 as described in the first embodiment, and thus the motor is assembled.

Effects of Embodiment

As described above, in the second embodiment of the present invention, the first substrate 51 and the second substrate 52 are connected together using the substrate retaining member 9, and thus the first substrate 51 and the second substrate 52 can be integrated together more firmly. Accordingly, the mounting position accuracy of the first substrate 51 and the second substrate 52 with respect to the stator 1 and the rigidity of the first substrate 51 and the second substrate 52 can be increased, and the performance of the motor 100 can be enhanced.

Further, since the substrate retaining member 9 includes the projections 92 contacting the top surface of the cavity 404 of the mold 400, it is possible to prevent the deformation of the first substrate 51 and the second substrate 52 at the time of molding and thereby contribute to enhancement in quality of the motor.

Third Embodiment

Figure 15:
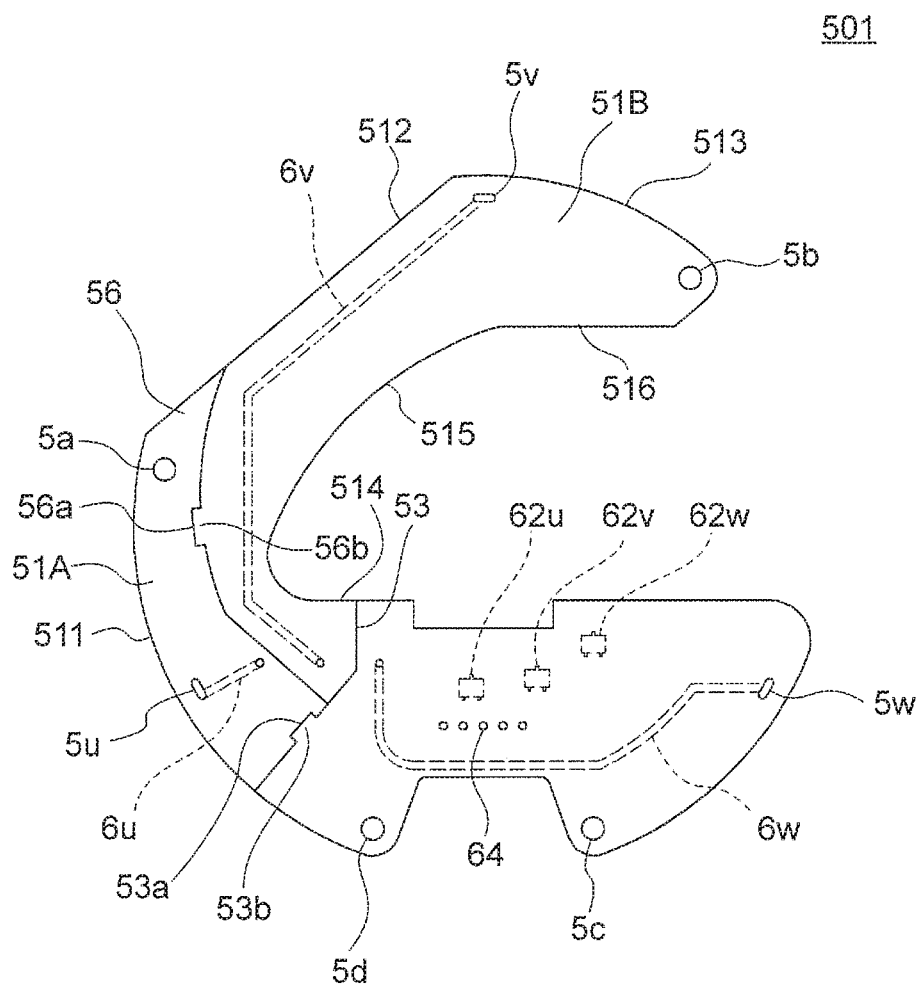
FIG. 15 is a plan view showing substrates in a third embodiment of the present invention.

Next, a third embodiment of the present invention will be described. FIG. 15 is a plan view showing a configuration of a substrate 501 in the third embodiment. The substrate 5 in the first embodiment described above is separated into the first substrate 51 and the second substrate 52. In contrast, the substrate 501 in the third embodiment is separated into a first substrate 51 and a second substrate 52, and the first substrate 51 is further separated into substrates 51A and 51B.
(Configuration of Substrates)

The substrate 51A (first substrate) is configured as a part including the U-phase power supply wiring 6u and the terminal insertion hole 5u. The substrate 51B (third substrate) is configured as a part including the V-phase power supply wiring 6v and the terminal insertion hole 5v. Further, the substrate 51A has an engagement hole 5a engaging with the pin 33a (FIG. 2) of the stator 1, and the substrate 51B has an engagement hole 5b engaging with the pin 33b (FIG. 2) of the stator 1.

A connection part 56 (separation surface) is formed between the substrates 51A and 51B. The connection part 56 includes a concave part 56a formed on the substrate 51A and a convex part 56b formed on the substrate 51B. The concave part 56a and the convex part 56b engage with each other, and thus the substrates 51A and 51B are connected together. The concave part 56a and the convex part 56b constitute an engagement part (second connection part). Incidentally, it is also possible to form the convex part on the substrate 51A and the concave part on the substrate 51B. Further, the substrates 51A and 51B may have any forms engaging with each other, not limited to a combination of the concave part and the convex part.

The second substrate 52 is configured similarly to the second substrate 52 (FIG. 8) in the first embodiment. Accordingly, by engaging the convex part 53b of the second substrate 52 and the concave part 53a of the substrate 51A with each other and engaging the concave part 56a of the substrate 51A and the convex part 56b of the substrate 51B with each other, the substrates 51A, 51B and 52 can be connected together. It is also possible to connect the substrates 51A, 51B and 52 together using the substrate retaining member 9 described in the second embodiment instead of using the engagement of the concave parts and the convex parts.

Incidentally, while the connection part 56 extends from the connection part 53 to the outer circumferential straight part 512 in the example shown in FIG. 15, the connection part 56 may be formed at any position as long as the substrates 51A and 51B can be separated without interfering with the power supply wirings 6u and 6v.

Effects of Embodiment

As described above, in the third embodiment of the present invention, the substrate 501 is separated into the substrate 51A (first substrate) including the power supply wiring 6u, the substrate 51B (third substrate) including the power supply wiring 6v, and the second substrate 52 including the power supply wiring 6w. Therefore, the substrates 51A, 51B and 52 can be configured to be small in size even in the case where the power supply terminals 41u, 41v and 41w of the stator 1 are arranged apart from each other.

Accordingly, the numbers of the substrates obtainable from the substrate base material can be increased and the manufacturing cost can be reduced.

Further, since the substrates 51A, 51B and 52 are connected together by the concave part 53a and the convex part 53b (first engagement part) and the concave part 56a and the convex part 56b (second engagement part), the mounting position accuracy of the substrates 51A, 51B and 52 with respect to the stator 1 and the rigidity of the substrates 51A, 51B and 52 can be increased.

Fourth Embodiment

Figure 16:
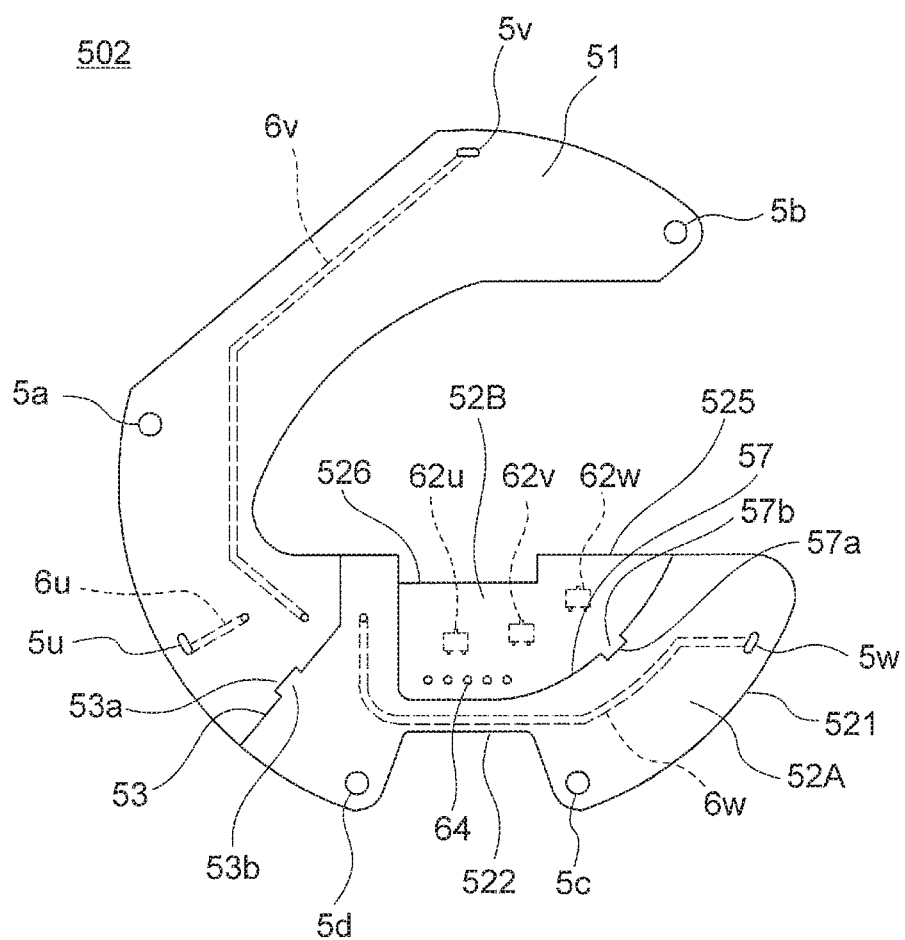
FIG. 16 is a plan view showing substrates in a fourth embodiment of the present invention.

Next, a fourth embodiment of the present invention will be described. FIG. 16 is a plan view showing a configuration of a substrate 502 in the fourth embodiment. The substrate 5 in the first embodiment described above is separated into the first substrate 51 and the second substrate 52. In contrast, the substrate 502 in the fourth embodiment is separated into a first substrate 51 and a second substrate 52, and the second substrate 52 is further separated into substrates 52A and 52B.
(Configuration of Substrates)

The substrate 52A (second substrate) is configured as a part including the power supply wiring 6w of the W-phase and the terminal insertion hole 5w. The substrate 52B (fourth substrate) is configured as a part including the Hall effect sensors 62u, 62v and 62w and their connection terminal part 64. Further, the substrate 52A has engagement holes 5c and 5d engaging with the pins 33c and 33d (FIG. 2) of the stator 1.

A connection part 57 (separation surface) is formed between the substrates 52A and 52B. The connection part 57 includes a concave part 57a formed on the substrate 52A and a convex part 57b formed on the substrate 52B. The concave part 57a and the convex part 57b engage with each other, and thus the substrates 52A and 52B are connected together. The concave part 57a and the convex part 57b constitute an engagement part (third connection part). Incidentally, it is also possible to form the convex part on the substrate 52A and the concave part on the substrate 52B. Further, the substrates 52A and 52B may have any forms engaging with each other, not limited to a combination of the concave part and the convex part.

The first substrate 51 is configured similarly to the first substrate 51 (FIG. 8) in the first embodiment. Accordingly, by engaging the concave part 53a of the first substrate 51 and the convex part 53b of the second substrate 52 with each other and engaging the concave part 57a of the substrate 52A and the convex part 57b of the substrate 52B with each other, the substrates 51, 52A and 52B can be connected together. It is also possible to connect the substrates 51, 52A and 52B together using the substrate retaining member 9 described in the second embodiment instead of using the engagement of concave and convex parts.

Incidentally, while the connection part 57 extends from the inner circumferential straight part 525 to an end of the groove-shaped part 526 described in the first embodiment in the example shown in FIG. 16, the connection part 57 may be formed at any position as long as the substrates 52A and 52B can be separated without interfering with the power supply wiring 6w, the Hall effect sensors 62u, 62v and 62w and the connection terminal part 64.

Effects of Embodiment

As described above, in the fourth embodiment of the present invention, the substrate 502 is separated into the first substrate 51 including the power supply wiring 6*u* and the power supply wiring 6*v*, the substrate 52A (second substrate) including the power supply wiring 6*w*, and the substrate 52B (fourth substrate) including the Hall effect sensors 62*u*, 62*v* and 62*w*. Therefore, the substrates 51, 52A and 52B can be configured to be small in size. Accordingly, the numbers of the substrates obtainable from the substrate base material can be increased and the manufacturing cost can be reduced.

Further, since the substrates 51, 52A and 52B are connected together by the concave part 53*a* and the convex part 53*b* (first engagement part) and the concave part 57*a* and the convex part 57*b* (third engagement part), the mounting position accuracy of the substrates 51, 52A and 52B with respect to the stator 1 and the rigidity of the substrates 51, 52A and 52B can be increased.

Furthermore, depending on a form of use of the motor, there may be a case where the Hall effect sensors 62*u*, 62*v* and 62*w* are not used. In such a case, it is also possible to use the motor while the substrate 52B is removed from the substrate 502.

Incidentally, in the fourth embodiment, it is also possible to further separate the first substrate 51 into the substrates 51A and 51B as described in the third embodiment.

While preferred embodiments of the present invention have been described specifically above, the present invention is not limited to the above-described embodiments and a variety of improvements or modifications are possible within the range not departing from the subject matter of the present invention.

What is claimed is:

1. A motor comprising:
a stator having a stator core in a ring shape, an insulator provided on the stator core, a first coil of a first phase wound around the stator core via the insulator, and a second coil of a second phase wound around the stator core via the insulator;
a first substrate mounted on the insulator of the stator and having a first power supply wiring to supply electric power to the first coil; and
a second substrate mounted on the insulator of the stator and having a second power supply wiring to supply electric power to the second coil,
wherein the first substrate has a first connection terminal part of the first power supply wiring;
wherein the second substrate has a second connection terminal part of the second power supply wiring;
wherein a connection part of the first substrate and the second substrate is provided between the first connection terminal part and the second connection terminal part; and
wherein a power supply connector is joined to the first connection terminal part and the second connection terminal part.

2. The motor according to claim 1, further comprising a first connection part connecting the first substrate and the second substrate together.

3. The motor according to claim 2, wherein the first connection part is an engagement part formed on the first substrate and the second substrate.

4. The motor according to claim 2, wherein the first connection part is a connection member attached to the first substrate and the second substrate.

5. The motor according to claim 4, wherein the connection member is arranged on a side opposite to the stator across the first substrate and the second substrate in a direction of a central axis line of the stator core, and
wherein the connection member has a projection projecting toward a side opposite to a side facing the stator.

6. The motor according to claim 1, wherein the stator has a first terminal electrically connected to the first coil and a second terminal electrically connected to the second coil;
wherein the first substrate has a first terminal insertion hole in which the first terminal is inserted; and
wherein the second substrate has a second terminal insertion hole in which the second terminal is inserted.

7. The motor according to claim 1, wherein the stator has a first pin and a second pin projecting in a direction of a central axis line of the stator core;
wherein the first substrate has an engagement hole engaging with the first pin; and
wherein the second substrate has an engagement hole engaging with the second pin.

8. The motor according to claim 1, wherein the stator further has a third coil of a third phase wound around the stator core, and
wherein the first substrate has a third power supply wiring to supply electric power to the third coil.

9. The motor according to claim 1, wherein the stator further has a third coil of a third phase wound around the stator core, and
wherein the motor further comprises a third substrate having a third power supply wiring to supply electric power to the third coil.

10. The motor according to claim 9, further comprising a second connection part connecting the third substrate to the first substrate and the second substrate.

11. The motor according to claim 1, further comprising a rotor provided inside the stator,
wherein the second substrate further has a Hall effect sensor to detect rotation of the rotor.

12. The motor according to claim 11, wherein the second substrate has a connection terminal part connected to the Hall effect sensor, and
wherein a sensor connector is joined to the connection terminal part.

13. The motor according to claim 1, further comprising:
a rotor provided inside the stator; and
a fourth substrate having a Hall effect sensor to detect rotation of the rotor.

14. The motor according to claim 13, further comprising a third connection part connecting the fourth substrate to the first substrate and the second substrate.

15. An air conditioner comprising:
an outdoor unit having a first fan and a first motor driving the first fan;
an indoor unit having a second fan and a second motor driving the second fan; and
a refrigerant pipe connecting the outdoor unit and the indoor unit,
wherein at least one of the first motor and the second motor has:
a stator having a stator core in a ring shape, an insulator provided on the stator core, a first coil of a first phase wound around the stator core via the insulator, and a second coil of a second phase wound around the stator core via the insulator;
a first substrate mounted on the insulator of the stator and having a first power supply wiring to supply electric power to the first coil; and
a second substrate mounted on the insulator of the stator and having a second power supply wiring to supply electric power to the second coil, wherein the first substrate has a first connection terminal part of the first power supply wiring;

wherein the second substrate has a second connection terminal part of the second power supply wiring;

wherein a connection part of the first substrate and the second substrate is provided between the first connection terminal part and the second connection terminal part; and wherein a power supply connector is joined to the first connection terminal part and the second connection terminal part.

16. The air conditioner according to claim 15, wherein the at least one of the first motor and the second motor comprises a first connection part connecting the first substrate and the second substrate together.

* * * * *